United States Patent
Ryu et al.

(10) Patent No.: US 10,882,275 B2
(45) Date of Patent: Jan. 5, 2021

(54) GAS BARRIER FILM WITH PROTECTIVE COATING LAYER CONTAINING INORGANIC PARTICLES

(71) Applicant: LG CHEM, LTD., Seoul (KR)

(72) Inventors: Sang Uk Ryu, Daejeon (KR); Dong Ryul Kim, Daejeon (KR); Jong Min Moon, Daejeon (KR)

(73) Assignee: LG CHEM, LTD., Seoul (KR)

(*) Notice: Subject to any disclaimer, the term of this patent is extended or adjusted under 35 U.S.C. 154(b) by 342 days.

(21) Appl. No.: 14/442,301

(22) PCT Filed: Nov. 29, 2013

(86) PCT No.: PCT/KR2013/011041
§ 371 (c)(1),
(2) Date: May 12, 2015

(87) PCT Pub. No.: WO2014/084686
PCT Pub. Date: Jun. 5, 2014

(65) Prior Publication Data
US 2016/0281229 A1  Sep. 29, 2016

(30) Foreign Application Priority Data

Nov. 29, 2012  (KR) .................. 10-2012-0137344
Nov. 29, 2013  (KR) .................. 10-2013-0147869

(51) Int. Cl.
*C23C 16/455* (2006.01)
*B32B 7/12* (2006.01)
*C09D 7/40* (2018.01)

(52) U.S. Cl.
CPC ............. *B32B 7/12* (2013.01); *C09D 7/67* (2018.01); *Y10T 428/259* (2015.01)

(58) Field of Classification Search
CPC .................. C23C 16/45525; C23C 16/403
See application file for complete search history.

(56) References Cited

U.S. PATENT DOCUMENTS

| | | | |
|---|---|---|---|
| 3,708,225 A | 1/1973 | Misch et al. | |
| 4,177,315 A | 12/1979 | Ubersax | |
| 4,198,465 A | 4/1980 | Moore et al. | |
| 4,229,228 A * | 10/1980 | Rotenberg | C09D 183/04 106/287.14 |
| 4,309,319 A | 1/1982 | Vaughn, Jr. | |
| 4,436,851 A | 3/1984 | Vaughn, Jr. | |
| 4,455,205 A | 6/1984 | Olson et al. | |

(Continued)

FOREIGN PATENT DOCUMENTS

DE  10231856 A1  2/2004
EP  1 418 197 A1  12/2001

(Continued)

OTHER PUBLICATIONS

Mikuni, Hiroyuki, JP 2012136614A, "Gas-barrier photosetting resin composition", Jul. 19, 2012 (Machine translation).*

*Primary Examiner* — Cheng Yuan Huang
(74) *Attorney, Agent, or Firm* — Dentons US LLP

(57) ABSTRACT

A gas barrier film with a protective layer including inorganic particles is provided. A gas barrier effect of the gas barrier film is improved by including inorganic nanoparticles in a protective layer when a protective coating is performed to protect a gas barrier layer.

12 Claims, 1 Drawing Sheet

(56) References Cited

U.S. PATENT DOCUMENTS

| | | | |
|---|---|---|---|
| 2006/0189113 A1* | 8/2006 | Vanheusden | B22F 1/0018 |
| | | | 438/597 |
| 2007/0273817 A1* | 11/2007 | Lee | G02F 1/133634 |
| | | | 349/119 |
| 2008/0138538 A1 | 6/2008 | Lewis | |
| 2010/0089636 A1 | 4/2010 | Ramadas et al. | |
| 2014/0154504 A1* | 6/2014 | Adachi | C09D 5/1693 |
| | | | 428/339 |
| 2015/0072451 A1 | 3/2015 | Schmid et al. | |
| 2015/0285972 A1* | 10/2015 | Hara | G02B 5/283 |
| | | | 428/323 |

FOREIGN PATENT DOCUMENTS

| | | |
|---|---|---|
| JP | 2007-90803 A | 4/2007 |
| JP | 2010-511267 A | 4/2010 |
| JP | 2011-20335 A | 2/2011 |
| JP | 2011-73417 A | 4/2011 |
| JP | 2011-511403 A | 4/2011 |
| JP | 2011-173261 A | 9/2011 |
| JP | 2011-194652 A | 10/2011 |
| JP | 2011-194653 A | 10/2011 |
| JP | 2012-096432 A | 5/2012 |
| JP | 2012-136614 A | 7/2012 |
| JP | 2012-182303 A | 9/2012 |
| KR | 10-2001-0076642 A | 8/2001 |
| KR | 10-2007-0103204 A | 10/2007 |
| KR | 10-2009-0074998 A | 7/2009 |
| WO | 03/087247 A1 | 10/2003 |
| WO | 2005/021621 A1 | 3/2005 |
| WO | 2008/057045 A1 | 5/2008 |
| WO | 2009/126115 A1 | 10/2009 |
| WO | 2010/140980 A1 | 12/2010 |

* cited by examiner

GAS BARRIER FILM WITH PROTECTIVE COATING LAYER CONTAINING INORGANIC PARTICLES

This application is a National Stage Entry of International Application No. PCT/KR2013/011041, filed Nov. 29, 2013, and claims the benefit of Korean Application No. 10-2012-0137344, filed on Nov. 29, 2012, and Korean Application No. 10-2013-0147869 filed Nov. 29, 2013, all of which are hereby incorporated by reference in their entirety for all purposes as if fully set forth herein.

TECHNICAL FIELD

The present invention relates to a gas barrier film, a method of preparing the same, and use of the gas barrier film.

BACKGROUND ART

A gas barrier film has a gas barrier property because an inorganic thin layer having a thickness from several tens to 100 nm is stacked. Examples of a method of forming the inorganic thin layer may include atomic layer deposition. The thin layer formed as described above is used as a metal barrier layer, a wear resistant film, or a corrosion resistant film in a semiconductor device because it has good thickness uniformity, film density, and conformality.

DISCLOSURE

Technical Problem

The present invention is directed to a gas barrier film capable of protecting products likely to be deteriorated by water, such as display devices or photovoltaic elements, specifically a gas barrier film in which inorganic particles are used for a protective layer of a gas barrier layer so that a gas barrier effect is maximized, a method of preparing the same, and use of the method.

Technical Solution

According to an aspect of the present invention, there is provided a gas barrier film including: a substrate layer; a barrier layer formed on the substrate layer; and a protective layer formed on the barrier layer so as to be in contact with the barrier layer, in which the protective layer contains nanoparticles and a binder and the nanoparticles are in an amount of 40 wt % to 70 wt % based on the total weight of the nanoparticles and the binder.

Hereinafter, the present invention will be described in detail.

The gas barrier film of the present invention includes a thin gas barrier layer, that is, an inorganic thin film formed on a substrate layer by atomic layer deposition, and a protective layer formed on the gas barrier layer so as to protect the gas barrier layer, in which the protective layer contains nanoparticles and a binder so that a gas barrier effect may be maximized.

The barrier layer of the gas barrier film of the present invention may be formed above or below the substrate layer, and may be used by attaching two sheets of composite films.

Examples of the substrate layer may include a metal oxide substrate, a semiconductor substrate, a glass substrate, a plastic substrate, and the like.

The substrate layer may be a monolayer, or a multilayer of two or more layers of the same or different kinds.

Also, the surface of the substrate layer may be subjected to corona treatment, atmospheric pressure plasma treatment, or adhesive primer treatment so as to enable adhesion.

Also, an intermediate layer may be further formed on the substrate layer.

The intermediate layer flattens the surface of the substrate layer having a surface roughness of tens to hundreds of nanometers, and uniformly distributes a functional group which is easily reacted with organometals on the surface of the substrate layer so that organometals to be used for atomic layer deposition may be uniformly adsorbed to the surface of the substrate layer. Accordingly, the intermediate layer may have, for example, a thickness of 0.1 nm to 10 nm or 0.3 μm to 2 μm. As the intermediate layer has the aforementioned thickness range, the rough surface of a commercially available substrate film is covered by the intermediate layer and flattened, thus preventing locally concentrated stress. Accordingly, cracks may minimally occur in bending or thermal contraction and expansion to improve durability of a composite film.

The intermediate layer may be optionally disposed on either or both surfaces of a primer treated substrate. Methods or materials for forming the intermediate layer are not specifically limited, and examples thereof include conventional materials of forming flattened layers such as an organic coating layer, an organic/inorganic mixed coating layer, or an inorganic coating layer.

The intermediate layer is conventionally formed of a coating composition including (i) a photoinitiator; (ii) a low molecular reactive diluent (for example, monomer acrylate); (iii) an unsaturated oligomer (for example, acrylate, urethane acrylate, polyether acrylate, epoxy acrylate, or polyester acrylate); and (iv) a solvent. Such an organic coating composition may be cured by a free radical reaction which is initiated according to a photodegradable route. A specific blend may be changed depending on desired final features. In one embodiment, an organic coating composition of the intermediate layer includes a UV-curable mixture of a monomer and an oligomer acrylate (preferably including methyl methacrylate and ethyl acrylate) in a solvent (for example, methyl ethyl ketone), in which the coating composition conventionally includes an acrylate in a solid content of 20 to 30 wt % based on the total weight of the composition, and further includes a small amount (for example, about 1 wt % of solid content) of a photoinitiator (for example, Irgacure™ 2959, manufactured by Ciba).

The term "lower molecular weight" described herein refers to a polymerizable monomer species. The term "reactive" refers to polymerizability of monomer species.

In another embodiment, an organic coating composition of the intermediate layer includes a crosslinkable organic polymer for example, polyethylene imine (PEI), polyester, polyvinyl alcohol (PVOH), polyamide, polythiol, or polyacrylic acid and a crosslinking agent (for example, Cymel™ 385 or those described herein) in a solvent (a general aqueous solvent). In this embodiment, the coating composition preferably includes PEI (preferably, with a molecular weight (Mw) in a range of 600,000 to 900,000).

An organic/inorganic mixed coating composition of the intermediate layer includes inorganic particles dispersed in an organic polymer matrix. Accordingly, the organic component conventionally includes reactive components with low molecular weight (for example, monomer acrylate); and/or unsaturated oligomer components (for example, acrylate, urethane acrylate, polyether acrylate, epoxy acrylate, and polyester acrylate). Such a coating composition is cured thermally or by a free radical reaction which is initiated according to a photodegradable route. Accordingly, the photoinitiator is selectively contained in the coating composition. A solvent is conventionally contained in the coating composition. Inorganic particles may be conventionally silica or a metal oxide (more typically silica) dispersed in a polymerizable organic matrix. The inorganic particles have an average particle diameter of preferably 0.005 to 3 μm; in one embodiment 0.01 μm or more; in one embodiment 1 μm or less. The inorganic particles may typically be selected not to substantially affect optical properties of a substrate or a composite film. In one embodiment, an amount of the inorganic particles is about 5 wt % to about 60 wt % of a solid content in the coating composition, and preferably an amount of about 5 wt % to about 60 wt % of a cured coating layer. Accordingly, in one embodiment, an organic/inorganic mixed coating composition includes reactive components with low molecular weight (for example, monomer acrylate); and/or unsaturated oligomer components (for example, acrylate, urethane acrylate, polyether acrylate, epoxy acrylate, and polyester acrylate), preferably inorganic particles selected from silica and a metal oxide, a solvent, and optionally a photoinitiator. In another embodiment, thermosetting organic/inorganic mixed coating composition preferably includes an epoxy resin with inorganic particles (preferably silica) at a concentration of about 10 wt % or more (preferably about 20 wt % or more and about 75 wt % or less) of a solid content in a coating composition (preferably including the total solid content at 5 to 20 wt % in an alcohol solution). In still another embodiment, a UV-curable organic/inorganic mixed coating composition includes a monomer acrylate (typically a polyfunctional acrylate) and inorganic particles (preferably silica) in a solvent (for example, methyl ethyl ketone), in which the coating composition conventionally includes an acrylate and silica in a solid content of about 5 to 50 wt % based on the total weight of the coating composition, and further includes a small amount (for example, solid content of about 1 wt %) of photoinitiator. The polyfunctional monomer acrylates have been known in the related art, and examples thereof include dipentaerythritol tetraacrylate and tris(2-acryloyloxyethyl) isocyanurate.

Also, an inorganic coating composition of the intermediate layer mainly includes a polymerizable inorganic matrix, for example, inorganic particles contained in a polysiloxane, and such a coating composition is conventionally cured thermally. In one embodiment, inorganic coating is derived from a coating composition including (a) about 5 to about 50 wt % of a solid content including an organic silanol partially polymerized by about 10 to about 70 wt % (preferably about 20 to 60 wt %) silica and about 90 to about 30 wt % RSi(OH)$_3$ (in which R is selected from about 40% or less of a group substituted by one selected from the group consisting of vinyl, phenyl, gamma-glycidoxypropyl, and gamma-methacyloxypropyl, and methyl), and (b) about 95 to about 50 wt % of a solvent including about 10 to about 90 wt % water and about 90 to about 10 wt % of an aliphatic lower alcohol. Specifically, the coating composition has a pH of about 3.0 to about 8.0, preferably about 3.0 to about 6.5, and preferably 4.0 or more. The silica component of the inorganic coating composition may be obtained by hydrolyzing tetraethyl orthosilicate to form polysilic acid. Hydrolysis may be performed a conventional method, for example adding, an aliphatic alcohol and an acid. Alternatively, silica to be used for the coating composition may be colloidal silica. Colloidal silica has a particle size of generally about 5 to 25 nm, preferably about 7 to 15 nm. General colloidal silica to be used includes commercially available products such as "Ludox SM," "Ludox-HS-30" and "Ludox LS" dispersion (Grace Davison). Organic silanol components are represented by a general formula: RSi(OH)$_3$. R group are methyl groups at about 60% or more, preferably about 80% to 100%. At most about 40% of R group are a higher alkyl group or aryl selected from vinyl, phenyl, gamma-glycidoxypropyl and gamma-methacryloxypropyl. Solvent components generally include a mixture of water and one or more aliphatic lower alcohols. The water generally occupies at about 10 to 90 wt % of the solvent and the aliphatic lower alcohol additionally occupies about 90 to 10 wt %. The aliphatic alcohol is generally an aliphatic alcohol having 1 to 4 carbon atoms, such as methanol, ethanol, n-propanol, iso-propanol, n-butanol, sec-butanol, and tert-butanol.

Other examples of the intermediate layer are disclosed in U.S. Pat. Nos. 4,198,465, 3,708,225, 4,177,315, 4,309,319, 4,436,851, 4,455,205, 0,142,362, WO2003/087247 and EP1418197.

A coating composition of the intermediate layer may be applied using usual coating methods including a continuous coating or a dip coating process. Coating is generally applied to have a thickness after drying of about 1 to about 20 μm, preferably about 2 to 10 μm, more preferably about 3 to about 10 μm. A coating composition may be applied in an "off-line" mode that is a different process from a film preparation process or an "in-line" mode in which a film preparation process is continuously performed. Coating is preferably performed in the in-line mode. The thermosetting coating composition which is applied on a substrate layer may be cured at about 20 to about 200° C., and preferably about 20 to about 150° C. Whereas the coating composition may be cured for several days at room temperature of 20° C., or may be cured for several seconds at heating temperature of 150° C.

Since the barrier layer is deposited on the intermediate layer, when the intermediate layer is not flattened, defects may occur during deposition of the gas barrier layer so that a gas barrier property is decreased. When flatness of the surface is decreased, a gas barrier property is increased. Accordingly, flatness of the intermediate layer may have Ra of less than 0.7 nm, preferably less than 0.6 nm, more preferably less than 0.5 nm, even more preferably less than 0.4 nm, even more preferably less than 0.3 nm, and ideally less than 0.25 nm, and/or Rq of less than 0.9 nm, preferably less than 0.8 nm, more preferably less than 0.75 nm, even more preferably less than 0.65 nm, even more preferably less than 0.6 nm, even more preferably less than 0.50 nm, even more preferably less than 0.45 nm, even more preferably less than 0.35 nm, and ideally less than 0.3 nm.

The surface of the intermediate layer may be subjected to plasma pretreatment before deposition of the gas barrier layer. Plasma pretreatment may be generally performed under an argon/nitrogen or argon/oxygen atmosphere for about 2 to 8 minutes, preferably about 5 minutes. Preferably, plasma pretreatment is microwave-activated. In other words, plasma pretreatment is performed using a microwave plasma generation source without another plasma generation source.

A gas barrier layer is formed on the intermediate layer by chemical bonds with functional groups in a coating layer, and therefore a peeling problem which is likely to occur in a multilayer composite film may be solved.

The barrier layer is applied on the surface of the intermediate layer. The barrier layer provides a sufficient barrier property to obtain water vapor and/or oxygen transmittance, and specifically, a water vapor transmittance rate is less than $10^{-3}$ g/m²/day and an oxygen transmittance rate is less than $10^{-3}$/mL/m²/day. Preferably, the water vapor transmittance rate is less than $10^{-4}$ g/m²/day, more preferably less than $10^{-5}$ g/m²/day, and most preferably less than $10^{-6}$ g/m²/day. Preferably, the water transmittance rate is less than $10^{-4}$ g/m²/day, and more preferably less than $10^{-5}$ g/m²/day.

The barrier layer is formed by atomic layer deposition (ALD) which is generally performed in a clean environment. ALD is self-limiting sequential surface chemistry which allows a conformal thin film of materials to be deposited on a substrate in an atomic level. A film grown by ALD is formed in layer-wise, and an atomic layer of a generated fine film is caused to be controlled to about 0.1 Å per monolayer. The total thickness of the deposited film is typically about 1 to 500 nm. Coating may be performed by ALD at a uniform thickness inside a deep trench, inside a porous medium, and around particles. An ALD-growth film is chemically bonded to a substrate layer. Description of an ALD process is described in detail in "Atomic Layer Epitaxy" by Tuomo Suntola in Thin Solid Films, vol. 216 (1992) pp. 84-89. While precursor materials are separately maintained during a coating process and reaction in ALD, ALD is chemically similar to chemical vapor deposition (CVD) except that a CVD reaction is split into two half reactions in ALD. During the process, precursor vapor of a layer is absorbed into a substrate in a vacuum chamber. Subsequently, the vapor is pumped from the chamber, and a thin layer formed of the absorbed precursor is deposited on the substrate. Subsequently, reactants are introduced into the chamber under a thermal condition which accelerates a reaction with the absorbed precursor such that a layer of target materials is formed. Reaction byproducts are pumped from the chamber. The substrate may be exposed again to precursor vapor and the deposition processes may be performed repeatedly to form a subsequent layer of the material. ALD is different from conventional CVD and physical vapor deposition (PVD) which is performed after growth is initiated on a limited number of nuclear forming portions on the surface of the substrate. CVD and PVD technologies may derive column growth having a granular fine structure, showing a boundary in which a gas easily permeates between columns. An ALD process includes a non-directional growth mechanism to obtain a fine structure having no characterization part. Suitable materials for a barrier layer which is formed by ALD in the present invention are inorganic materials and include oxides, nitrides, and sulfides of groups IVB, VB, VIB, IIIA, IIB, IVA, VA and VIA of the periodic table, and combinations thereof. Specifically, oxides, nitrides, or mixtures of oxides and nitrides are preferable. Oxides show attractive optical transparency to electronic displays and photovoltaic cells, such that visible rays are discharged from the element or enter the element. Also, nitrides of Si and Al are transparent in the visible spectrum. For examples, $SiO_2$, $Al_2O_3$, ZnO, ZnS, $HfO_2$, HfON, AlN, or $Si_3N_4$ can be used.

Precursors which are used for the ALD process to form such barrier materials are known widely (for example, see M. Leskela and M. Ritala, "ALD precursor chemistry: Evolution and future challenges," Journal de Physique IV, vol. 9, pp 837-852 (1999) and references cited therein). A temperature of a substrate preferable for synthesis of a barrier coating by ALD is 50 to 250° C. Since dimensional changes of the substrate cause chemical decomposition or collapse of ALD coating, it is not preferable for the temperature to exceed 250° C.

A thickness of the barrier layer is preferably 2 nm to 100 nm, and more preferably 2 to 50 nm. When a thickness of the layer is decreased, the film may endure bending without generation of cracks, which is an important property for flexible substrates in electronic devices since cracking deteriorates barrier properties. Also, when a thickness of the barrier film is decreased, it is clearer, which is an important property when the barrier film is used for optoelectronic devices. The minimum thickness of the barrier layer is a thickness required for continuous film coverage.

The protective layer is formed on the barrier layer to be in contact with the barrier layer, in which the protective layer contains nanoparticles and a binder, and an amount of the nanoparticles is 40 wt % to 70 wt % based on the total weight of the nanoparticles and the binder.

The nanoparticles may be spherical nanoparticles having an average diameter of 100 nm, specifically 1 to 90 nm, specifically 1 to 80 nm, specifically 1 to 70 nm, specifically 1 to 60 nm, more specifically 1 to 50 nm, and even more specifically 5 to 50 nm. Examples of the nanoparticles include silica particles, alumina particles, titania particles, zirconia particles, antimony oxide particles or zinc oxide particles.

An amount of the nanoparticles may be 40 wt % to 70 wt % based on the total weight of the nanoparticles and the binder. Specifically, an amount of the nanoparticles having an average diameter of 10 to 20 nm may be 40 wt % to 60 wt % or 45 wt % to 55 wt %. The nanoparticles in the aforementioned range may express a more suitable water barrier property-improving effect.

The binder may include at least one selected from the group consisting of a radical curable compound and a cationic curable compound.

The radical curable compound may be classified as a radical polymerizable monofunctional group monomer, a radical polymerizable polyfunctional group monomer, or a radical polymerizable oligomer.

Examples of the radical polymerizable monofunctional group monomer include acrylic acid, methyl acrylate, hexyl acrylate, 2-ethylhexyl acrylate, 2-hydroxyethyl acrylate, 2-hydroxypropyl acrylate, tetrahydrofurfuryl acrylate, phenoxyethyl acrylate, trioxyethyl acrylate, nonylphenoxyethyl acrylate, tetrahydro furfuryloxyethyl acrylate, phenoxy diethyleneglycol acrylate, benzyl acrylate, butoxyethyl acrylate, cyclohexyl acrylate, dicyclopentanyl acrylate, dicyclopentenyl acrylate, glycidyl acrylate, carbitol acrylate, isobornyl acrylate, and the like.

Examples of the radical polymerizable polyfunctional group monomer include 1,6-hexanediol diacrylate, neopentyl glycol diacrylate, diethylene glycol diacrylate, tripropylene glycol diacrylate, dicyclopentanyl diacrylate, butylene glycol diacrylate, pentaerythritol diacrylate, trimethylolpropane triacrylate, propionoxide modified trimethylolpropane triacrylate, pentaerythritol triacrylate, ditrimethylolpropane tetraacrylate, dipentaerythritol hexaacrylate, caprolactone modified dipentaerythritol hexaacrylate, tetramethylolmethane tetraacrylate, and the like.

Examples of the radical polymerizable oligomer include polyester acrylate, polyether acrylate, urethane acrylate, epoxy acrylate, polyol acrylate, and the like.

Examples of the cationic curable compound include a cationic polymerizable epoxy compound, a vinyl ether compound, an oxetane compound, an oxolane compound, a cyclic acetal compound, a cyclic lactone compound, a thiirane compound, a thiovinylether compound, a spirortho ester compound, an ethylenic unsaturated compound, a cyclic ether compound, a cyclic thioether compound, or the like, and preferably, a cationic polymerizable epoxy compound or an oxetane compound.

Examples of the cationic polymerizable epoxy compound include a cresol novolac type epoxy resin, a phenol novolac type epoxy resin, or the like, and preferably a phenol novolac type epoxy resin.

Examples of the cationic polymerizable epoxy compound include an alicyclic epoxy compound, an aromatic epoxy compound, an aliphatic epoxy compound, or the like, and at least one selected from the aforementioned compounds may be used.

The term "alicyclic epoxy compound" herein means a compound including at least one alicyclic epoxy group. The term "alicyclic epoxy group" in the specification means a functional group including an epoxy group formed by two carbon atoms in an aliphatic saturated hydrocarbon ring.

Examples of the alicyclic epoxy compound include an epoxycyclohexylmethyl epoxycyclohexanecarboxylate-based compound, an epoxycyclohexane carboxylate-based compound of an alkanediol, an epoxy cyclohexylmethyl ester-based compound of a dicarboxylic acid, an epoxycyclohexylmethyl ether-based compound of polyethylene glycol, an epoxycyclohexylmethyl ether-based compound of an alkanediol, a diepoxytrispiro-based compound, a diepoxymonospiro-based compound, a vinylcyclohexene diepoxide compound, an epoxycyclopentyl ether compound, a diepoxy tricyclo decane compound, or the like.

Examples of the alicyclic epoxy compound include a difunctional epoxy compound, that is, a compound having two epoxy groups, and preferably a compound in which two epoxy groups are alicyclic epoxy groups, but are not limited thereto.

Examples of the aliphatic epoxy compound include an epoxy compound which has an aliphatic epoxy group without an alicyclic epoxy group. Examples of the aliphatic epoxy compound include a polyglycidyl ether of an aliphatic polyvalent alcohol; a polyglycidyl ether of an alkylene oxide adduct of an aliphatic polyvalent alcohol; a polyglycidyl ether of a polyester polyol of an aliphatic polyvalent alcohol and an aliphatic polyvalent carboxylic acid; a polyglycidyl ether of an aliphatic polyvalent carboxylic acid; a polyglycidyl ether of a polyester polycarboxylic acid of an aliphatic polyvalent alcohol and an aliphatic polyvalent carboxylic acid; a dimer, an oligomer, or a polymer obtained by vinyl polymerization of glycidyl acrylate or glycidyl methacrylate; or an oligomer or polymer obtained by vinyl polymerization of a vinyl-based monomer different from glycidyl acrylate or glycidyl methacrylate, preferably a polyglycidyl ether of an aliphatic polyvalent alcohol or an alkylene oxide adduct thereof, but are not limited thereto.

Examples of the aliphatic polyvalent alcohol include aliphatic polyvalent alcohols having 2 to 20 carbon atoms, 2 to 16 carbon atoms, 2 to 12 carbon atoms, 2 to 8 carbon atoms or 2 to 4 carbon atoms, for example, an aliphatic diol such as ethylene glycol, 1,2-propanediol, 1,3-propanediol, 2-methyl-1,3-propanediol, 2-butyl-2-ethyl-1,3-propanediol, 1,4-butanediol, neopentyl glycol, 3-methyl-2,4-pentanediol, 2,4-pentanediol, 1,5-pentanediol, 3-methyl-1,5-pentanediol, 2-methyl-2,4-pentanediol, 2,4-diethyl-1,5-pentanediol, 1,6-hexanediol, 1,7-heptanediol, 3,5-heptanediol, 1,8-octanediol, 2-methyl-1,8-octanediol, 1,9-nonanediol, or 1,10-decanediol; an alicyclic diol such as cyclohexane dimethanol, cyclohexanediol, hydrogenated bisphenol A, or hydrogenated bisphenol F; trimethylolethane; trimethylolpropane; hexytols; pentitols; glycerin; polyglycerin; pentaerythritol; dipentaerythritol; tetramethylolpropane; or the like.

Also, examples of the alkylene oxide include alkylene oxides having 1 to 20 carbon atoms, 1 to 16 carbon atoms, 1 to 12 carbon atoms, 1 to 8 carbon atoms or 1 to 4 carbon atoms, for example, ethylene oxide, propylene oxide, butylene oxide, or the like.

Also, examples of the aliphatic polyvalent carboxylic acid include, oxalic acid, malonic acid, succinic acid, glutaric acid, adipic acid, pimelic acid, suberic acid, azelaic acid, sebacic acid, dodecanedioic acid, 2-methylsuccinic acid, 2-methyladipic acid, 3-methyladipic acid, 3-methylpentanedioic acid, 2-methyloctanedioic acid, 3,8-dimethyldecanedioic acid, 3,7-dimethyldecanedioic acid, 1,20-eicosamethylene dicarboxylic acid, 1,2-cyclopentanedicarboxylic acid, 1,3-cyclopentanedicarboxylic acid, 1,2-cyclohexanedicarboxylic acid, 1,3-cyclohexanedicarboxylic acid, 1,4-cyclohexanedicarboxylic acid, 1,4-dicarboxylmethylenecyclohexane, 1,2,3-propanetricarboxylic acid, 1,2,3,4-butanetetracarboxylic acid, 1,2,3,4-cyclobutanetetracarboxylic acid, or the like, but are not limited.

The aliphatic epoxy compound includes a compound having at least three epoxy groups, preferably three epoxy groups, without an alicyclic epoxy group, which is preferable in terms of a curing property, weather resistance, and a refractive index, but is not limited thereto.

The aromatic epoxy compound is an epoxy compound including an aromatic group in one molecule, and for example, includes a bisphenol type epoxy resin such as a bisphenol A-based epoxy, a bisphenol F-based epoxy, a bisphenol S epoxy, a brominated bisphenol-based epoxy; a novolac type epoxy resin such as a phenolnovolac type epoxy resin and a cresolnovolac type epoxy resin; a cresol epoxy, a resorcinol glycidyl ether, and the like.

Examples of the cationic polymerizable oxetane compound include 3-ethyl-3-hydroxymethyl oxetane, 1,4-bis[(3-ethyl-3-oxetanyl)methoxymethyl]benzene, 3-ethyl-3-(phenoxymethyl)oxetane, di[(3-ethyl-3-oxetanyl)methyl]ether, 3-ethyl-3-(2-ethylhexyloxymethyl)oxetane, phenolnovolac oxetane, and the like. Examples of the oxetane compound include "ARONE oxetane OXT-101," "ARONE oxetane OXT-121," "ARONE oxetane OXT-211," "ARONE oxetane OXT-221," "ARONE oxetane OXT-212" (manufactured by TOAGOSEI Co., Ltd.), and the like.

Examples of a cationic polymerizable compound include preferably an epoxy compound, more preferably an epoxy resin such as a cresol novolac type epoxy resin or a phenol novolac type epoxy resin.

The protective layer further includes a radical initiator or a cationic initiator as a component to initiate a curing reaction.

Examples of the radical initiator include a radical photoinitiator, a radical thermal initiator, and the like. Examples of the radical photoinitiator include initiators such as benzoine-based initiators, a hydroxyketone compound, an aminoketone compound, a phosphine oxide compound, and the like. Specific examples of the photoinitiator include benzoine, benzoine methylether, benzoine ethylether, benzoine isopropylether, benzoine n-butylether, benzoine isobutylether, acetophenone, dimethylamino acetophenone, 2,2-dimethoxy-2-phenylacetophenone, 2,2-diethoxy-2-phenylacetophenone, 2-hydroxy-2-methyl-1-phenylpropan-1-one, 1-hydroxycyclohexylphenylketone, 2-methyl-1-[4-(methylthio)phenyl]-2-morpholino-propan-1-one, 4-(2-hydroxyethoxy)phenyl-2-(hydroxy-2-propyl)ketone, benzophenone, p-phenylbenzophenone, 4,4'-diethylaminobenzophenone, dichlorobenzophenone, 2-methylanthraquinone, 2-ethylanthraquinone, 2-t-butylanthraquinone, 2-amino anthraquinone, 2-methylthioxanthone, 2-ethylthioxanthone, 2-chlorothioxanthone, 2,4-dimethylthioxanthone, 2,4- diethylthioxanthone, benzyldimethylketal, acetophenone dimethylketal, p-dimethylamino benzoic acid ester, oligo[2-hydroxy-2-methyl-1-[4-(1-methylvinyl)phenyl]propanone], bis(2,4,6-trimethylbenzoyl)-phenyl-phosphine oxide, 2,4,6-trimethylbenzoyl-diphenyl-phosphine oxide, and the like, but are not limited thereto.

Examples of the cationic initiator include cationic photoinitiators which discharge components capable of initiating cationic polymerization by radiation of activation energy rays or application of heat, that is, cationic photoinitiators, cationic thermal initiators, and the like.

Examples of the cationic photoinitiator include ionized cationic initiators of onium salts or organometallic salt series, or non-ionized cationic photoinitiators such as organic silanes or latent sulfonic acid series or other non-ionized compounds. Examples of the initiators of onium salt series include diaryliodonium salts, triarylsulfonium salts, aryldiazonium salts, and the like. Examples of the initiators of organometallic salt series include iron arenes, and the like. Examples of the initiators of organic silane series include o-nitrobenzyl triaryl silyl ethers, triaryl silyl peroxides, acyl silanes, and the like. Examples of the initiators of latent sulfonic acid series include α-sulfonyloxy ketones, α-hydroxymethylbenzoine sulfonates, and the like, but are not limited thereto. Also, the cationic initiator includes a mixture of an initiator of an iodine series and a photosensitizer.

Examples of the cationic initiator include an ionized cationic photoinitiator, preferably an ionized cationic photoinitiator of an onium series, and an ionized cationic photoinitiator of a triarylsulfonium salt series, but are not limited thereto.

A thickness of the protective layer is suitably determined depending on use materials, a light transmittance rate required for a gas barrier film, and required durability. When a thickness of a protective layer formed on a barrier layer is very thin, the protective layer does not satisfactorily protect the barrier layer. Meanwhile, when a thickness of the protective layer is increased, transparency of the film is decreased. Specifically, when insulation materials are used, such a problem becomes serious. When a thickness of the protective layer is increased, a thickness of a gas barrier film also increases. Accordingly, a thickness of the barrier layer is preferably 0.2 µm to 2 µm, and more preferably 0.5 µm to 1 µm.

The aforementioned gas barrier film of the present invention may have a water vapor transmittance rate of 0.00085 to 0.00100 g/m²/day.

FIG. 1 is a cross-sectional schematic diagram of a gas barrier film according to one embodiment of the present invention. Referring to FIG. 1, a gas barrier film 10 according to one embodiment of the present invention sequentially includes a substrate layer 14, an intermediate layer 13, and a barrier layer 12. Also, a protective layer 11 is attached on the barrier layer 12 to further improve durability and a gas barrier property.

FIG. 2 is a cross-sectional schematic diagram of a gas barrier film according to another embodiment of the present invention. Referring to FIG. 2, a gas barrier film 20 according to one embodiment of the present invention sequentially includes a substrate layer 24, an intermediate layer 23, and a barrier layer 22. Also, the intermediate layer 23 and the barrier layer 22 are attached to each other and a protective layer 21 is attached on the barrier layer 22.

The gas barrier film of the present invention is also applied to prepare a piezoelectric film (in the case of AlN or ZnO), a conductive film (in the case of ITO or ZnO:Al), or an optical film (in the case of $Al_2O_3$, $SiO_2$, $Ta_2O_5$, or $TiO_2$) depending on kinds and objects of inorganic materials used for the barrier layer, to improve durability and homogeneity of a deposited film.

According to still another aspect of the present invention, there is provided a method of preparing a gas barrier film including: forming a coating layer which contains nanoparticles and a binder precursor and in which an amount of the nanoparticles is 40 wt % to 70 wt % based on the total weight of the nanoparticles and the binder precursor on a barrier layer formed on a substrate layer so as to be in contact with the barrier layer to form a protective layer.

The method of preparing a gas barrier film of the present invention includes forming a barrier layer on the substrate layer by atomic layer deposition; and forming a protective layer on the barrier layer, in which the protective layer controls the nanoparticles in an amount of 40 wt % to 70 wt % based on the total weight of the nanoparticles and the binder precursor, thus maximizing a gas barrier effect.

Specifically, the protective layer may be controlled such that an amount of nanoparticles having an average diameter of 10 to 20 nm may be 45 wt % to 55 wt %.

The substrate layer of the present invention may be subjected to suitable attachment treatment such as corona discharge treatment, ultraviolet radiation treatment, plasma treatment or sputtering etching treatment.

The barrier layer is formed on the substrate layer by atomic layer deposition, and an intermediate layer may be further formed between the substrate layer and the barrier layer to flatten the surface of the substrate layer and improve attachment to organometals for formation of the barrier layer.

Attachment of the barrier layer and a surface density of inorganic materials are increased by a high density of hydroxyl groups on the intermediate layer, and thus durability and capacity of a gas barrier film may be increased significantly.

Advantageous Effect

According to still another aspect of the present invention, there is provided an electronic device including the gas barrier film of the present invention in which durability and a gas barrier property are improved.

The gas barrier film of the present invention may be used to protect products likely to be deteriorated by water, for example, display devices such as a liquid crystal display (LCD) or an organic light emitting diode (OLED) or photovoltaic elements such as solar cell.

DETAILED DESCRIPTION OF EXEMPLARY EMBODIMENTS

Figure 1:
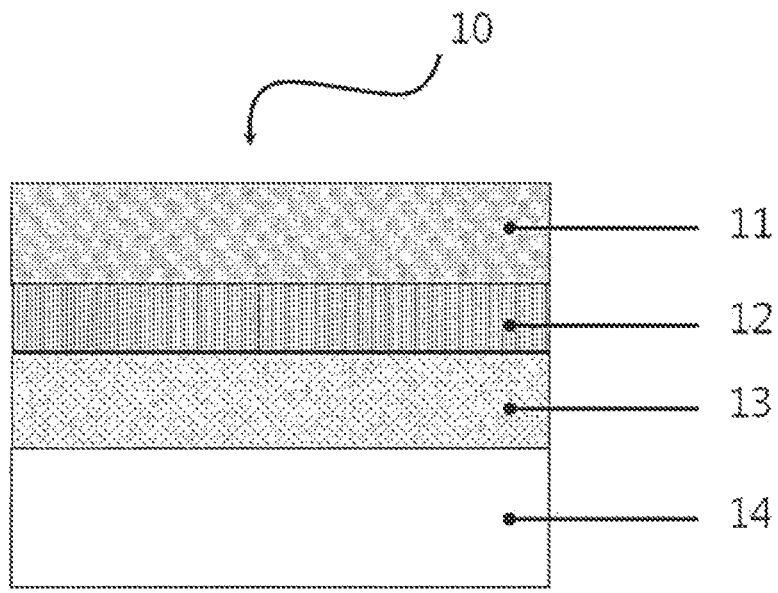
FIG. 1 is a diagram showing a gas barrier film according to one example of the present invention.
Figure 2:
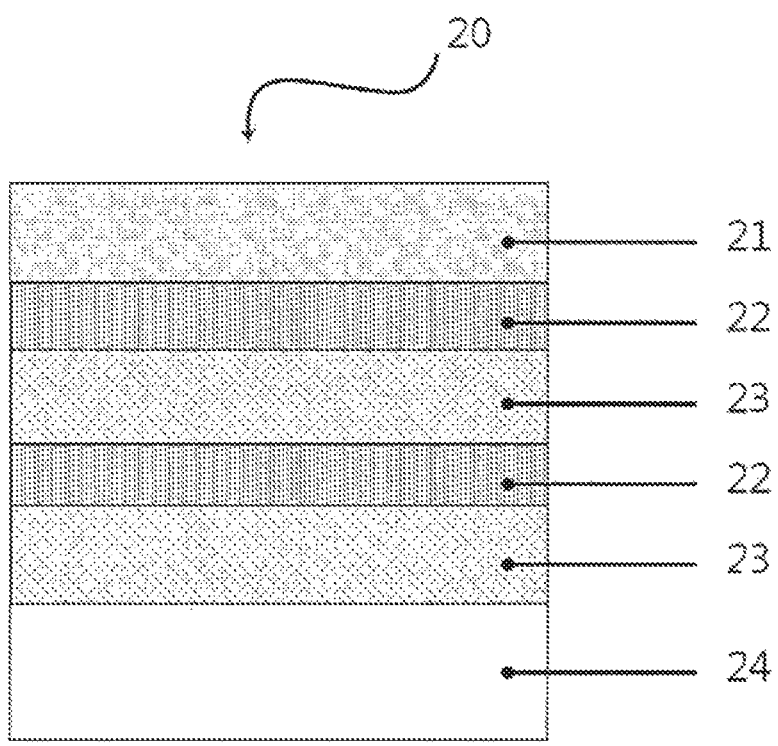
FIG. 2 is a diagram showing a structure of a gas barrier film according to another example of the present invention.

Hereinafter, the present invention will be described in detail through Examples which follow the present invention and Comparative Examples which do not follow the present invention, but scope of the present invention is not limited to the following Examples.

Example 1

A polycarbonate film having a thickness of about 100 µm and a water vapor transmission rate (WVTR) of about 4 g/m²/day was used as a substrate layer. 50 g of tetraethoxy orthosilicate and 50 g of 3-glycidoxypropyltrimethoxysilane were diluted with 150 g of ethanol, 56.4 g of water and 1.6 g of 0.1 N HCl were added thereto, and then the mixture was reacted for one day at room temperature to form a coating composition solution in a sol state. The coating composition solution was coated on the substrate layer by bar coating, and thermally cured for 10 minutes at 120° C. to form a flattened coating layer having a thickness of about 0.6 μm.

Subsequently, an $Al_2O_3$ layer was formed as a barrier layer to have a thickness of about 15 nm on the flattened layer by atomic layer deposition (ALD). Specifically, trimethyl aluminum (TMA) and $H_2O$ were respectively deposited and reacted in a pulse shape for 5 seconds on an intermediate layer to form a film having a thickness of 15 nm, followed by purging with argon gas to remove unreacted $H_2O$ and byproducts. Such processes were set to one cycle, and the cycle was performed 40 times to form a barrier layer. Subsequently, a coating liquid including pentaerythritol triacrylate and a 3-isocyanatopropyltriethoxysilane adduct as a binder and spherical silica particles having an average diameter of about 15 nm and an initiator (Irgacure 127) (an amount of the silica particles was about 50 wt % based on the total weight of the binder and the silica particles) was prepared, the coating liquid was applied on the barrier layer and cured through UV curing to form a protective layer having a thickness of about 0.5 μm, and thus a gas barrier film was prepared.

Example 2

A gas barrier film was prepared in the same manner as in Example 1 except that the amount of the silica particles was about 60 wt % based on the total weight of the binder and the silica particles in a coating solution used when a protective layer was formed.

Example 3

A gas barrier film was prepared in the same manner as in Example 1 except that spherical silica particles having an average diameter of about 50 nm were used when a protective layer was formed.

Example 4

A gas barrier film was prepared in the same manner as in Example 1 except that the amount of the silica particles was about 40 wt % based on the total weight of the binder and the silica particles in a coating solution used when a protective layer was formed.

Example 5

A gas barrier film was prepared in the same manner as in Example 1 except that a solution in which pentaerythritol triacrylate, 3-isocyanatopropyltriethoxysilane adduct and 3-gylcidoxypropyltrimethoxysilane were provided as a binder and an initiator (Irgacure 127 and Irgacure 250) (an amount of the silica was about 50 wt % based on the total weight of the binder and the silica particles) was used.

Comparative Example 1

A gas barrier film was prepared in the same manner as in Example 1 except that silica particles were not used when the protective layer was formed.

Comparative Example 2

A gas barrier film was prepared in the same manner as in Example 1 except that the amount of the silica particles was about 30 wt % based on the total weight of the binder and the silica particles in a coating solution used when a protective layer was formed.

Comparative Example 3

A gas barrier film was prepared in the same manner as in Example 1 except that the amount of the silica particles was about 80 wt % based on the total weight of the binder and the silica particles in a coating solution used when a protective layer was formed.

Experimental Example 1

WVTRs, light transmittances, and hazes of the gas barrier films prepared in Examples 1 to 4 and Comparative Examples 1 to 3 were measured by the following methods.

1) WVTR: WVTR was measured for 48 hours at 38° C. and 100% of relative humidity by an ASTM F 1249 method using Aquatran Model 1.

2) Light transmittance (Tt): Light transmittance was measured in a visible region of 380 to 780 nm using UV-3600 manufactured by Shimadzu corporation.

(3) Haze: Haze was measured using HM-150 manufactured by Murakami Color Research Laboratory.

TABLE 1

|  | Tt (%) | Haze | WVTR (g/m² · day) |
|---|---|---|---|
| Example 1 | 92.8 | 0.1 | 0.0021 |
| Example 2 | 92.8 | 0.1 | 0.0030 |
| Example 3 | 92.0 | 0.3 | 0.0052 |
| Example 4 | 92.6 | 0.1 | 0.0049 |
| Comparative Example 1 | 92.8 | 0.1 | 0.0124 |
| Comparative Example 2 | 92.8 | 0.1 | 0.0073 |
| Comparative Example 3 | 92.7 | 0.1 | 0.0092 |

Description of Reference Numerals 10, 20: Gas barrier film structure
12, 22: Barrier layer
14, 24: Substrate layer
11, 21: Protective layer
13, 23: Intermediate layer

The invention claimed is:

1. A gas barrier film consisting of:
a substrate layer;
a barrier layer;
an intermediate layer between the barrier layer and the substrate layer, the intermediate layer having a thickness of 0.3 μm to 2 μm and comprising a silica component comprising a hydrolysis reaction product of tetraethyl orthosilicate or tetraethoxy orthosilicate and a silane containing a substituent selected from the group consisting of vinyl, phenyl, gamma-glycidoxypropyl, gamma-methacryloxypropyl and methyl; and
a cured protective layer formed on the barrier layer so as to be in contact with the barrier layer,
wherein the cured protective layer is a curing reaction product of a coating composition that contains spherical nanoparticles, an initiator and a binder, wherein:

the nanoparticles are present in an amount of 40 wt % to 70 wt % based on the total weight of the nanoparticles and the binder;

the nanoparticles have an average diameter of 10 to 20 nm; and the binder is selected from the group consisting of 1,6-hexanediol diacrylate, neopentyl glycol diacrylate, diethylene glycol diacrylate, tripropylene glycol diacrylate, dicyclopentanyl diacrylate, butylene glycol diacrylate, pentaerythritol diacrylate, trimethylolpropane triacrylate, propionoxide modified trimethylolpropane triacrylate, pentaerythritol triacrylate, ditrimethylolpropane tetraacrylate, dipentaerythritol hexaacrylate, caprolactone modified dipentaerythritol hexaacrylate, tetramethylolmethane tetraacrylate, polyester acrylate, polyether acrylate, urethane acrylate, epoxy acrylate, polyol acrylate and a combination thereof.

2. The gas barrier film of claim 1, wherein the nanoparticles are silica particles, alumina particles, titania particles, zirconia particles, antimony oxide particles, or zinc oxide particles.

3. The gas barrier film of claim 1, wherein the initiator is a radical initiator or a cationic initiator.

4. The gas barrier film of claim 1, wherein the cured protective layer has a thickness of 0.2 μm to 2 μm.

5. The gas barrier film of claim 1, wherein the barrier layer includes $SiO_2$, $Al_2O_3$, ZnO, ZnS, $HfO_2$, HfON, AlN, or $Si_3N_4$.

6. The gas barrier film of claim 1, wherein the barrier layer is an atomic layer deposition layer.

7. The gas barrier film of claim 1, wherein the barrier layer has a thickness of 2 nm to 100 nm.

8. The gas barrier film of claim 1, wherein the silica component in the intermediate layer is a hydrolysis reaction product of tetraethoxy orthosilicate with 3-glycidoxypropyltrimethoxysilane.

9. A method of preparing the gas barrier film of claim 1, comprising:

applying on a substrate an intermediate layer an intermediate layer having a thickness of 0.3 μm to 2 μm and comprising a silica component comprising a hydrolysis reaction product of tetraethyl orthosilicate or tetraethoxy orthosilicate and a silane containing a substituent selected from the group consisting of vinyl, phenyl, gamma-glycidoxypropyl gamma-methacyloxypropyl and methyl;

applying a barrier layer on the intermediate layer;

applying on the barrier layer a coating composition which contains spherical nanoparticles, an initiator and a binder, wherein:

the nanoparticles are present in an amount of 40 wt % to 70 wt % based on the total weight of the nanoparticles and the binder and have an average diameter of 10 to 20 nm; and the binder is selected from the group consisting of 1,6-hexanediol diacrylate, neopentyl glycol diacrylate, diethylene glycol diacrylate, tripropylene glycol diacrylate, dicyclopentanyl diacrylate, butylene glycol diacrylate, pentaerythritol diacrylate, trimethylolpropane triacrylate, propionoxide modified trimethylolpropane triacrylate, pentaerythritol triacrylate, ditrimethylolpropane tetraacrylate, dipentaerythritol hexaacrylate, caprolactone modified dipentaerythritol hexaacrylate, tetramethylolmethane tetraacrylate, polyester acrylate, polyether acrylate, urethane acrylate, epoxy acrylate, polyol acrylate and a combination thereof; and initiating a curing reaction of the coating composition to form a protective layer.

10. The method of claim 9, wherein the barrier layer is formed by atomic layer deposition.

11. The method of claim 9, wherein the silica component in the intermediate layer is a hydrolysis reaction product of tetraethoxy orthosilicate with 3-glycidoxypropyltrimethoxysilane.

12. An electronic device comprising the gas barrier film of claim 1.

* * * * *